US012787478B2

(12) United States Patent
Liu et al.

(10) Patent No.: US 12,787,478 B2
(45) Date of Patent: Nov. 3, 2026

(54) SOLAR CELL, PHOTOVOLTAIC MODULE AND METHOD FOR FORMING SOLAR CELL

(71) Applicants: JINKO SOLAR (HAINING) CO., LTD., Haining (CN); ZHEJIANG JINKO SOLAR CO., LTD., Haining (CN)

(72) Inventors: Zhaoxuan Liu, Haining (CN); Jingsheng Jin, Haining (CN); Nannan Yang, Haining (CN); Bike Zhang, Haining (CN); Bo Zhang, Haining (CN); Rumeng Song, Haining (CN)

(73) Assignees: JINKO SOLAR (HAINING) CO., LTD., Haining (CN); ZHEJIANG JINKO SOLAR CO., LTD., Haining (CN)

( * ) Notice: Subject to any disclaimer, the term of this patent is extended or adjusted under 35 U.S.C. 154(b) by 0 days.

(21) Appl. No.: 19/083,854

(22) Filed: Mar. 19, 2025

(65) Prior Publication Data

US 2025/0311468 A1 Oct. 2, 2025

(30) Foreign Application Priority Data

Apr. 1, 2024 (CN) ......................... 202410389532.2
Apr. 1, 2024 (CN) ......................... 202410399975.X

(51) Int. Cl.
*H10F 77/1223* (2025.01)
*H10F 77/30* (2025.01)

(52) U.S. Cl.
CPC ....... *H10F 77/1223* (2025.01); *H10F 77/311* (2025.01)

(58) Field of Classification Search
CPC ........................... H10F 77/1223; H10F 77/311
See application file for complete search history.

(56) References Cited

U.S. PATENT DOCUMENTS

2015/0017793 A1* 1/2015 Hallam ................. H10P 32/171 438/540
2016/0049540 A1* 2/2016 Kapur ................... H10F 71/121 136/256

(Continued)

FOREIGN PATENT DOCUMENTS

CN 106449384 A 2/2017
CN 114784148 * 7/2022

(Continued)

OTHER PUBLICATIONS

Lohmuller, et al., "Towards 90% Bifaciality for P-Type Cz—Si Solar Cells by Adaption of Industrial PERC Processes", Fraunhofer Institute for Solar Energy Systems ISE, Heidenhofstrasse 2, 2018, pp. 3727-3731.

(Continued)

*Primary Examiner* — Jayne L Mershon
(74) *Attorney, Agent, or Firm* — Ballard Spahr LLP

(57) ABSTRACT

A solar cell includes a substrate, a first doped conductive layer, a local doping region, and a first electrode. The first layer is formed at one side of the substrate. The local doping region is formed at one side of the first layer away from the substrate, and the local doping region is doped with a same doping element as that in the first layer and first element. The first electrode is provided at one side of the local doping region away from the first layer and electrically connected to the local doping region. This structure can reduce the surface barrier, thereby reducing the contact resistivity between the first electrode and the local doping region, so that the first electrode forms better ohmic contact with the local doping region, which is conducive to the transport of carriers, improving the filling factor, and improving the efficiency.

19 Claims, 3 Drawing Sheets

(56) References Cited

U.S. PATENT DOCUMENTS

| | | | | |
|---|---|---|---|---|
| 2020/0007074 | A1* | 1/2020 | Peterson | H02S 40/36 |
| 2023/0387336 | A1* | 11/2023 | Yang | H10F 77/311 |
| 2023/0387337 | A1* | 11/2023 | Shen | H10F 10/14 |
| 2023/0395740 | A1* | 12/2023 | Mao | H10F 10/10 |
| 2023/0402552 | A1* | 12/2023 | Wang | H10F 19/904 |
| 2023/0411551 | A1* | 12/2023 | Jin | H10F 71/1221 |
| 2024/0429327 | A1* | 12/2024 | Liu | H10F 10/166 |
| 2025/0176348 | A1* | 5/2025 | Ding | H10K 30/86 |
| 2026/0052796 | A1* | 2/2026 | Wang | H10F 77/16 |

FOREIGN PATENT DOCUMENTS

| | | | |
|---|---|---|---|
| CN | 217933805 | U | 11/2022 |
| CN | 116864548 | A | 10/2023 |
| WO | 2013142892 | A1 | 10/2013 |

OTHER PUBLICATIONS

Lee, et al., "Interface Engineering for the Passivation of C—Si with O3-Based Atomic Layer Deposited AlO For Solar Cell Application", Applied Physics Letters 100, 143901, 2012, pp. 143901-1-143901-4, http;//dx.doi.org/10.1063/1.3701280.

Khaldi, et al., "Ultra-Shallow P-type Doping of Silcon by Performing Atomic Layer Deposition of Al2O3 Thin Films Onto SiO2/Si", Royal Society of Chemistry, Chem Comm., 2024, pp. 11754-11757, https://doi.org/10.1039/d4cc04510f.

Norouzi, et al., "Development and Characterization of A10/SiN:B Layer Systems for Surface Passivation and Local Laser Doping", IEEE Journal of Photovoltaics., vol. 7 No. 5, Sep. 2017, pp. 1244-1253.

European Search Report for European Application No. 251618542 mailed Aug. 21, 2025.

* cited by examiner

SOLAR CELL, PHOTOVOLTAIC MODULE AND METHOD FOR FORMING SOLAR CELL

CROSS-REFERENCE TO RELATED APPLICATIONS

This application claims the benefit of Chinese patent application No. 202410399975.X, filed on Apr. 1, 2024, entitled "SOLAR CELL, PHOTOVOLTAIC MODULE AND METHOD FOR FORMING SOLAR CELL", and Chinese patent application No. 202410389532.2, filed on Apr. 1, 2024, entitled "SOLAR CELL, PHOTOVOLTAIC MODULE AND METHOD FOR FORMING SOLAR CELL", the entire content of which is incorporated herein in its entirety.

TECHNICAL FIELD

The present disclosure relates to the technical field of photovoltaic cells, and in particular, to a solar cell, a photovoltaic module and a method for forming solar cell.

BACKGROUND

A solar cell is an optoelectronic semiconductor wafer that uses sunlight to generate electricity directly, and is also known as "solar chip" or "photovoltaic cell". As long as the solar cell is illuminated with certain illumination conditions, it can instantly output a voltage and generate a current in the presence of a loop.

A solar cell generally includes a substrate, a doped conductive layer, a passivation layer, and a metal electrode. At present, when the metal electrode is formed at a surface of the substrate, the metal electrode needs to pass through the passivation layer to be in electrical contact with the doped conductive layer. Since the material of the doped conductive layer is a semiconductor material, the contact resistance between the metal and the semiconductor material is large, which easily cause a drop in the cell efficiency.

SUMMARY

In view of this, the present disclosure provides a solar cell, a photovoltaic module, and a method for forming a solar cell, to facilitate solving the problem in the related art that the contact resistance between the metal and the semiconductor material is large, which easily cause a drop in the cell efficiency.

A first aspect of the present disclosure provides a solar cell, including: a substrate, a first doped conductive layer, a local doping region and a first electrode. The first doped conductive layer is formed at one side of the substrate. The local doping region is formed at one side of the first doped conductive layer away from the substrate, and the local doping region is doped with a same doping element as that in the first doped conductive layer and first element. The first electrode is provided at one side of the local doping region away from the first doped conductive layer and electrically connected to the local doping region.

In a possible embodiment, the first element is one selected from the group consisting of aluminum element, titanium element, zinc element, zirconium element, hafnium element, molybdenum element, tungsten element, and nickel element.

In a possible embodiment, the local doping region covers an entire surface of one side of the first doped conductive layer away from the substrate.

In a possible embodiment, the solar cell further includes a first passivation layer provided at a surface of one side of the local doping region away from the first doped conductive layer, and the first electrode passes through the first passivation layer to be electrically connected to the local doping region.

In a possible embodiment, the local doping region is provided at a portion of the first doped conductive layer corresponding to the first electrode.

In a possible embodiment, the solar cell further includes a first passivation layer, at least a part of the first passivation layer is provided at a surface of one side of the first doped conductive layer away from the substrate, and the first electrode passes through the first passivation layer to be electrically connected to the local doping region.

In a possible embodiment, the first passivation layer has the same metal element as the first element.

In a possible embodiment, the first passivation layer is an aluminum oxide layer.

In a possible embodiment, a thickness of the local doping region along a thickness direction of the solar cell is d, where 1 nm≤d≤200 nm.

In a possible embodiment, in the local doping region, the first element accounts for 0.01% to 0.05% of a total number of atoms.

In a possible embodiment, a concentration of the first element in the local doping region increases along a direction away from the substrate.

In a possible embodiment, the local doping region is further doped with oxygen element; and in the local doping region.

In a possible embodiment, the oxygen element accounts for 0.05% to 0.3% of a total number of atoms.

In a possible embodiment, a concentration of the oxygen element in the local doping region increases along a direction away from the substrate.

In a possible embodiment, along a thickness direction of the solar cell, a projected area of the local doping region is 10% to 100% of a projected area of the solar cell.

In a possible embodiment, the solar cell further includes: a tunnel oxide layer provided at one side of the substrate facing away from the first doped conductive layer; a second doped conductive layer provided at one side of the tunnel oxide layer away from the substrate; and a second electrode provided at one side of the second doped conductive layer away from the substrate and electrically connected to the second doped conductive layer.

In a possible embodiment, the substrate includes P-type conductive regions and N-type conductive regions which are arranged alternately and provided at intervals; each of the P-type conductive regions is provided with the first doped conductive layer, the local doping region and the first electrode which are arranged sequentially, and the first electrode is electrically connected to the local doping region; and each of the N-type conductive regions is provided with a third doped conductive layer and a third electrode which are arranged sequentially, and the third electrode is electrically connected to the third doped conductive layer.

In a possible embodiment, the solar cell further includes a third passivation layer provided at one side of the substrate facing away from the P-type conductive regions and the N-type conductive regions.

In a possible embodiment, a sectional shape of the local doping region is one of rectangle, triangle, semicircle and trapezoid.

A second aspect of the present disclosure provides a photovoltaic module, including: a cell string formed by connecting a plurality of solar cells as described in any one of the above-described embodiments; an encapsulation layer for covering a surface of the cell string; and a cover plate for covering a surface of the encapsulation layer away from the cell string.

A third aspect of the present disclosure provides a method for forming a solar cell, the method is used for forming the solar cell as described in any one of the above-described embodiments, and the method includes: providing the substrate; forming the first doped conductive layer at one side of the substrate; forming the local doping region at one side of the first doped conductive layer facing away from the substrate, the local doping region being doped with the first element; and forming the first electrode at one side of the local doping region facing away from the first doped conductive layer, the first electrode being electrically connected to the local doping region.

In a possible embodiment, said forming the local doping region at one side of the first doped conductive layer facing away from the substrate includes: forming a first passivation layer including the first element at a surface of one side of the first doped conductive layer facing away from the substrate; and heating the first passivation layer to convert at least a part of the first doped conductive layer that is in contact with the first passivation layer to form the local doping region. Herein, a heating temperature is controlled to be within a range from 200° C. to 400° C., and a constant-temperature duration is controlled to be within a range from 1s to 400s.

In a possible embodiment, said forming the local doping region at one side of the first doped conductive layer facing away from the substrate includes: introducing an aluminum source. Herein, a flow rate of introducing the aluminum source is within a range from 10 sccm to 30 sccm, and a duration of introducing the aluminum source is within a range from 1s to 300s.

In a possible embodiment, the method further includes, prior to forming the first passivation layer including the first element at the surface of one side of the first doped conductive layer facing away from the substrate: performing masking at a region of the first doped conductive layer not corresponding to the electrode.

In a possible embodiment, the method for forming the solar cell satisfies at least one of the following conditions: 1) a thickness of the local doping region is d, where 1 nm≤d≤200 nm; 2) an ambient pressure intensity is within a range from 3 mbar to 15 mbar; 3) along a thickness direction of the solar cell, a projected area of the local doping region is 10% to 100% of a projected area of the solar cell; 4) in the local doping region, the first element accounts for 0.01% to 0.05% of a total number of atoms; and 5) the local doping region is further doped with oxygen element, and in the local doping region, the oxygen element accounts for 0.05% to 0.3% of a total number of atoms.

In the present disclosure, the local doping region is doped with the same doping element as that in the first doping conductive layer and first element, a band gap width of the first element is lower than a band gap width of the silicon element, and in the doping process of first element, the first element can be substitutionally doped or gap doped in the first doping conductive layer to form the local doping region, so that the surface barrier of the local doping region can be reduced and the band gap width of the local doping region is reduced, thereby reducing the contact resistivity between the first electrode and the local doping region, so that the first electrode can form better ohmic contact with the local doping region, thereby reducing the loss of carriers in the transport process, which is conducive to the transport of carriers, improving the fill factor of the solar cell, and improving the efficiency of the solar cell.

It should be understood that both the foregoing general description and the following detailed description are only exemplary and cannot limit the disclosure.

BRIEF DESCRIPTION OF DRAWINGS

In order to better illustrate the technical solutions of the embodiments of the present disclosure, the accompanying drawings required to be used in the embodiments will be introduced briefly in the following. Apparently, the accompanying drawings in the following description are only some embodiments of the present disclosure, and those skilled in the art can also obtain other drawings according to these drawings without creative labor.

REFERENCE NUMERALS

Figure 1:
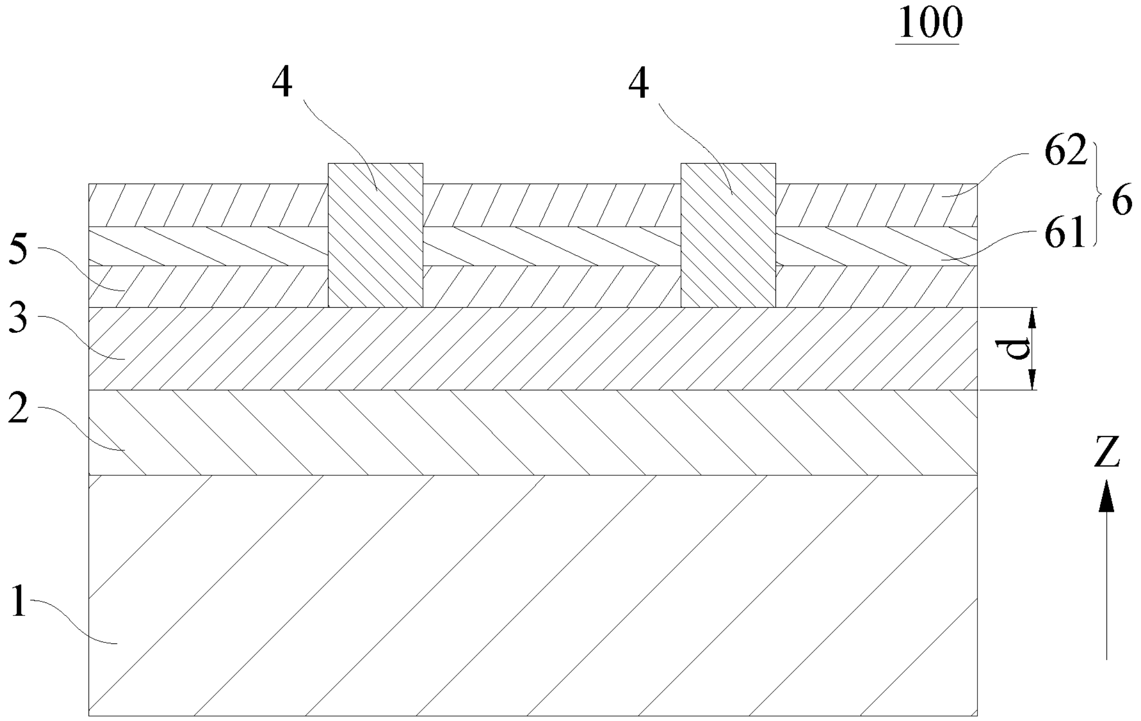
FIG. 1 is a schematic diagram of a cross-sectional structure of a solar cell according to some embodiments of the present disclosure.

100—solar cell;
1—substrate;
  111—P type conductive region;
  112—N-type conductive region;
2—first doped conductive layer;
3—local doping region;
4—first electrode;
5—first passivation layer;
6—second passivation layer;
  61—silicon nitride layer;
  62—silicon oxynitride layer;
7—second doped conductive layer;
8—tunnel oxide layer;
9—second electrode;
10—third passivation layer;
11—third doped conductive layer;
12—third electrode;
13—fourth passivation layer;
110—cell string;
120—encapsulation layer;
130—cover plate;
Z—thickness direction.

The accompanying drawings here, which are incorporated in and constitute a part of the description, show the embodiments consistent with the present disclosure and, together with the description, serve to explain the principles of the present disclosure.

DESCRIPTION OF EMBODIMENTS

In order to better illustrate the technical solutions of the present disclosure, the embodiments of the present disclosure are described in detail below in conjunction with the accompanying drawings.

In the description of this disclosure, the terms "first" and "second" are used for descriptive purposes only and are not to be construed as indicating or implying relative importance; unless otherwise explicitly specified or indicated, the term "multiple/a plurality of" means two or more; and the terms "connection", "fixation" and the like are to be construed in a broad sense, for example, "connection" may be a fixed connection, a detachable connection, or an integral connection, an electrical connection, a direct connection, or an indirect connection through an intermediary. For those of ordinary skill in the art, the specific meanings of the above terms in the present disclosure can be understood according to the specific circumstances.

The terms used in the embodiments the present disclosure is for the purpose of describing particular embodiments only and is not intended to limit the disclosure. As used in the embodiments of the present disclosure and in the attached claims, the singular forms "a/an", "the", and "said" are intended to include plural form as well, unless the context clearly dictates otherwise.

It should be understood that the term "and/or" as used herein merely describes associations between associated objects, and it indicates three types of relationships, for example, A and/or B may indicate that A exists alone, A and B coexist, or B exists alone. In addition, the character "/" herein generally indicates that the associated objects are in an "or" relationship.

It should be noted that the directional words such as "upper", "lower", "above", "below", "left", "right" and the like described in the embodiments of the present disclosure are described at the perspective shown in the accompanying drawings, and should not be understood as limiting the embodiments of the present disclosure. Further, in this context, it should be understood that when referring to an element being connected "above" or "below" another element, the element can not only be directly connected "above" or "below" the another element, but the element can also be indirectly connected "above" or "below" the another element via an intermediate element.

A solar cell is an optoelectronic semiconductor wafer that uses sunlight to generate electricity directly, and also known as "solar chip" or "photovoltaic cell". As long as the solar cell is illuminated with certain illumination conditions, it can instantly output a voltage and generate a current in the presence of a loop.

A solar cell generally includes a substrate, a doped conductive layer, a passivation layer, and a metal electrode. At present, when the metal electrode is formed at a surface of the substrate, the metal electrode needs to pass through the passivation layer to be in electrical contact with the doped conductive layer. Since the material of the doped conductive layer is a semiconductor material, the contact resistance between the metal and the semiconductor material is large, which easily cause a drop in the cell efficiency.

In view of this, the present disclosure provides a solar cell, a photovoltaic module, and a method for forming a solar cell, to reduce the surface barrier of the solar cell, thereby reducing the contact resistance between the metal electrodes and the semiconductor material, improving the fill factor of the solar cell, and improving the efficiency of the solar cell. The solar cell can be applied to a variety of cell structures including, but not limited to, a tunnel oxide passivated contact (TOPCon) cell, an interdigitated back contact (IBC) cell, a passivated emitter rear cell (PERC), etc., no limitation is made herein.

As shown in FIG. 1, a solar cell 100 includes a substrate 1, a first doped conductive layer 2, a local doping region 3, and a first electrode 4. The first doped conductive layer 2 is formed at one side of the substrate 1, the local doping region 3 is formed at one side of the first doped conductive layer 2 away from the substrate 1, and the local doping region 3 is doped with a same doping element as that in the first doped conductive layer 2 and first element. The first electrode 4 is provided at one side of the local doping region 3 away from the first doped conductive layer 2, and the first electrode is 4 are electrically connected to the local doping region 3.

According to the aforementioned embodiment, the local doping region 3 is doped with the same doping element as that in the first doping conductive layer 2 and first element, a band gap width of the first element is lower than a band gap width of the silicon element, and in the doping process of first element, the first element can be substitutionally doped or gap doped in the first doping conductive layer 2 to form the local doping region 3, so that the surface barrier of the local doping region 3 can be reduced and the band gap width of the local doping region 3 is reduced, thereby reducing the contact resistivity between the first electrode 4 and the local doping region 3, so that the first electrode 4 can form better ohmic contact with the local doping region 3, thereby reducing the loss of carriers in the transport process, which is conducive to the transport of carriers, improving the fill factor of the solar cell 100, and improving the efficiency of the solar cell 100.

As shown in FIG. 1, the substrate 1 is used for receiving incident light and generating photo-generated carriers. In some embodiments, the substrate 1 is a silicon substrate, which may include one or more of monocrystalline silicon, polycrystalline silicon, amorphous silicon, or microcrystalline silicon. In some embodiments, the material of the substrate 1 may also be silicon carbide, an organic material, or a multi-component compound. The multi-component compound may include, but is not limited to, materials such as perovskite, gallium arsenide, cadmium telluride, copper indium selenide, and the like. Exemplarily, in some embodiments of the present disclosure, the substrate 1 is a monocrystalline silicon substrate. The substrate 1 contains a doping element, and the type of the doping element may be N-type or P-type. The N-type element may be a Group V element, such as phosphorus (P) element, bismuth (Bi) element, antimony (Sb) element, arsenic (As) element, and the like. The P-type element may be a Group III element, such as boron (B) element, aluminum (Al) element, gallium (Ga) element, indium (In) element, and the like. For example, when the substrate 1 is a P-type silicon substrate, the type of the doping element in the substrate 1 is P-type. In another example, when the substrate 1 is an N-type silicon substrate, the type of the doping element in the substrate 1 is N-type. Exemplarily, in some embodiments of the present disclosure, the substrate 1 is an N-type silicon substrate, thereby improving the conversion efficiency of the solar cell 100 and reducing manufacturing cost.

The first doped conductive layer 2 may serve as an emitter, and the first doped conductive layer 2 and the substrate 1 have different types of doping elements, and the two may together form a PN junction structure. Exemplarily, when the substrate 1 is an N-type silicon substrate, the first doped conductive layer 2 of P-type may be formed by performing boron diffusion on the substrate 1.

The local doping region 3 is in contact with the first electrode 4 and functions as a carrier transport bridge.

The first electrode 4 is used for collecting and converging the current of the solar cell 100. Exemplarily, the first electrode 4 may be formed in a screen printing and sintering manner. In some embodiments, the metal paste used for forming the first electrode 4 may be one or more of aluminum, silver, gold, nickel, molybdenum, or copper, no limitation is made herein.

In some embodiments, as shown in FIG. 1, the local doping region 3 is doped with the same doping element as that in the first doping conductive layer 2 and first element. The first element is one selected from the group consisting of aluminum element, titanium element, zinc element, zirconium element, hafnium element, molybdenum element, tungsten element, and nickel element. The band gap width of the aluminum element is lower than the band gap width of the silicon element, and in the doping process of aluminum element, aluminum atoms can occupy the positions of silicon atoms to form Si—Al bonds through substitutional doping, or aluminum atoms can be interstitially doped between the Si—Si bonds, so that the surface barrier of the local doping region 3 can be reduced and the band gap width of the local doping region 3 is reduced, thereby reducing the contact resistivity between the first electrode 4 and the local doping region 3, so that the first electrode 4 can form better ohmic contact with the local doping region 3, thereby reducing the loss of carriers in the transport process, which is conducive to the transport of carriers, improving the fill factor of the solar cell 100, and improving the efficiency of the solar cell.

The fill factor represents a ratio of the maximum output power ImVm of the solar cell to the limit output power IscVoc of the solar cell, and the larger the fill factor is, the better the performance of the solar cell is.

In some embodiments, as shown in FIG. 1, the local doping region 3 can cover an entire surface of the first doped conductive layer 2 away from the substrate 1.

In some embodiments, as shown in FIG. 1, the local doping region 3 completely covers the surface of one side of the first doped conductive layer 2, so that an additional masking step is not required in the process of forming the local doping region 3, thereby reducing the difficulty for forming the local doping region 3, reducing forming processes, being capable of improving the formation efficiency of the solar cell 100, and saving formation cost.

In alternative embodiments, a sectional shape of the local doping region 3 is one of rectangle, triangle, semicircle, and trapezoid. When the sectional shape of the local doping region 3 is one of rectangle, triangle, semicircle, and trapezoid, the structure of the local doping region 3 is simple, which is convenient to form in the doping process, and it is easy to form a structure in which the concentration of the first element in the locally doped region 3 gradually increases along the direction away from the substrate 1, so as to ensure that the local doping region 3 can form a good ohmic contact with the first electrode 4, and avoid the doping concentration of the first element from being too high. It is beneficial to mass production of solar cells 100 and saves preparation cost.

Figure 2:
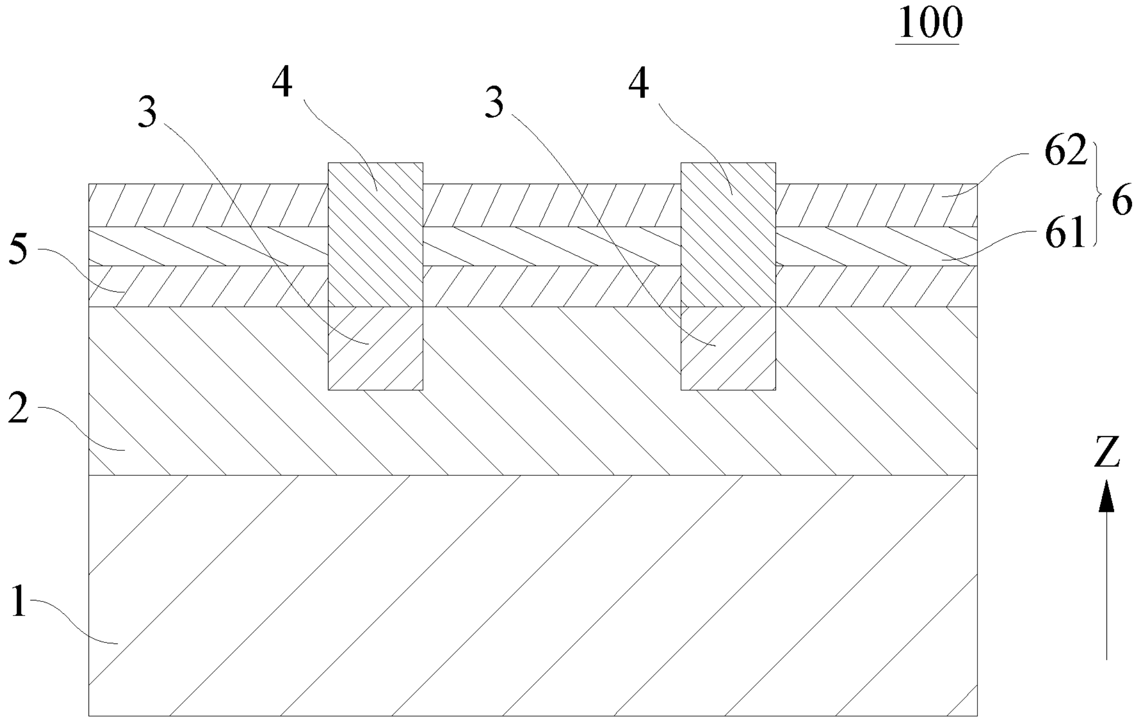
FIG. 2 is a schematic diagram of a cross-sectional structure of a solar cell according to some embodiments of the present disclosure.

Further, as shown in FIG. 2, the solar cell 100 further includes a first passivation layer 5 provided at a surface of the one side of the local doping region 3 away from the first doped conductive layer 2, and a first electrode 4 passes through the first passivation layer 5 to be electrically connected to the local doping region 3.

In some embodiments, the first passivation layer 5 can achieve a good passivation for the surface of one side of the local doping region 3 away from the substrate 1, reduce the interface state density, reduce the recombination of minority carriers, improve the transport efficiency of carriers at the interface, and improve the efficiency of the solar cell 100. The first passivation layer 5 may also have the function of reducing or eliminating the reflected light at the surface of the solar cell and increasing the amount of light transmittance, thereby further improving the photoelectric conversion efficiency of the solar cell.

In an example, the first passivation layer 5 may be deposited at one side of the local doping region 3 away from the first doped conductive layer 2 by using a plasma improved chemical vapor deposition method, and it should be noted that, the first passivation layer 5 may also be formed by using other methods, such as an organic chemical vapor deposition method, or the like. The first passivation layer 5 may be a single-layer structure or a stacked-layer structure, and a refractive index and a thickness of each layer can be correspondingly designed. In an example, the first passivation layer 5 may be any one of aluminum oxide layer, a silicon nitride layer, a silicon oxynitride layer, and a silicon oxide layer, or a combination thereof. It should be noted that, the first passivation layer 5 may also adopt another type of passivation layer, no limitation is made herein.

In some embodiments, as shown in FIG. 2, the local doping region 3 may be provided at a portion of the first doped conductive layer 2 corresponding to the first electrode 4.

The doping of first element can reduce the band gap width and reduce the contact resistivity with the first electrode 4, thereby forming better ohmic contact. However, if the doping concentration of the first element is too high, it is easy to cause the loss of carriers in the transport process, resulting in Auger recombination and reducing the efficiency of the solar cell.

In some embodiments, as shown in FIG. 2, the local doping region 3 is provided at a portion of the first doped conductive layer 2 corresponding to the first electrode 4, so that while ensuring that the local doping region 3 can form better ohmic contact with the first electrode 4, the first element doping concentration at a portion of the first doped conductive layer 2 not corresponding to the first electrode 4 (i.e., at a region not corresponding to the first electrode) is prevented from being too high, so as to reduce the loss of carriers in the transmission process, reduce Auger recombination, avoid the loss of current and turn-on voltage, and further improve the efficiency of the solar cell 100.

When the local doping region 3 is provided at a portion of the first doped conductive layer 2 corresponding to the first electrode 4, exemplarily, the local doping region 3 may be provided at a surface of one side of the first doped conductive layer 2 facing away from the substrate 1; exemplarily, the local doping region 3 may also be partially provided in the first doped conductive layer 2; or exemplarily, the local doping region 3 may also be provided in the first doped conductive layer 2, as long as it is ensured that the first electrode 4 can be electrically connected to the local doping region 3, no limitation is made herein.

Further, as shown in FIG. 2, the solar cell 100 further includes a first passivation layer 5, at least a part of the first passivation layer 5 is provided at a surface of one side of the first doped conductive layer 2 away from the substrate 1, and the first electrode 4 passes through the first passivation layer 5 to be electrically connected to the local doping region 3.

In some embodiments, as shown in FIG. 2, the first passivation layer 5 can achieve a good passivation for the surface of one side of the first doped conductive layer 2 facing away from the substrate 1, reduce the interface state density, reduce the recombination of minority carriers, improve the transport efficiency of carriers at the interface, and improve the efficiency of the solar cell 100. The first passivation layer 5 may also have the function of reducing or eliminating the reflected light at the surface of the solar cell and increasing the amount of light transmittance, thereby further improving the photoelectric conversion efficiency of the solar cell.

In an example, the first passivation layer 5 can be deposited at one side of the first doped conductive layer 2 facing away from the substrate 1 by using a plasma improved chemical vapor deposition method, and it should be noted that, the first passivation layer 5 can also be formed by using other methods, such as an organic chemical vapor deposition method, or the like. The first passivation layer 5 may be a single-layer structure or a stacked-layer structure, and a refractive index and a thickness of each layer may be correspondingly designed. In an example, the first passivation layer 5 may be any one of aluminum oxide layer, a silicon nitride layer, a silicon oxynitride layer, and a silicon oxide layer, or a combination thereof. It should be noted that, the first passivation layer 5 may also adopt another type of passivation layer, no limitation is made herein.

In some embodiments, as shown in FIGS. 1 and 2, the above-described first passivation layer 5 may be an aluminum oxide layer.

When the first passivation layer 5 is an aluminum oxide layer, the first passivation layer 5 itself contains negative charges. When the substrate 1 is an N-type silicon substrate and the first doped conductive layer 2 is a P-type emitter, the minority carriers in the first doped conductive layer 2 and the local doping region 3 are electrons containing negative charges. At this time, the negative charges in the first passivation layer 5 can repel the minority carriers in the first doped conductive layer 2 and the local doping region 3, thereby being capable of preventing the minority carriers in the first doped conductive layer 2 and the local doping region 3 from arriving at the surface and form recombination, thereby reducing the surface recombination rate, improving the surface passivation effect, and improving the efficiency of the solar cell. The aluminum oxide can also play a role in protecting the solar cell 100 from corrosion, and at the same time improve the stability and abrasion resistance of the solar cell 100, and extend the service life of the solar cell 100.

In addition, when the first passivation layer 5 is an aluminum oxide layer, an atomic layer deposition (ALD) technique may be used to deposit the first element at the first doped conductive layer 2 to form the first passivation layer 5, and under a continuous heating and continuous source supplying condition, the first element is advanced to the inside of the first doped conductive layer 2, doping the first element in the first passivation layer 5 into the first doped conductive layer 2 to form the local doping region 3 having a certain thickness, and the distribution curve of the first element is a linear structure. The depth and concentration of the first element in the first doped conductive layer 2 can be adjusted by controlling the reaction temperature and reaction time, which has the advantages of precise control, low cost, and simple operation, and the like. And, because the first element in the first passivation layer 5 is used as a diffusion source of the first element, with which the first doped conductive layer 2 is doped, the diffusion process can be carried out directly in a chamber of a ALD equipment, without the need for an additional equipment and without the need to replace the chamber and the existing process, thereby further reducing the difficulty of performing aluminum doping on the first doped conductive layer 2, thus making the formation of the local doping region 3 easier, improving the efficiency of the production of the solar cell, and saving cost.

It should be noted that, in some other embodiments, the first element may be injected in the first doped conductive layer 2 to form the local doping region 3 by other means, such as ion implantation, etc., or the local doping region 3 may be directly formed at a side of the first doped conductive layer 2 facing away from the substrate 1, no limitation is made herein.

As shown in FIGS. 1 and 2, when the first passivation layer 5 is an aluminum oxide layer, its thickness in a thickness direction Z may be within a range from 1 nm to 10 nm. Further, the thickness of the aluminum oxide layer may be within a range from 3 nm to 5 nm, so as to avoid that the aluminum oxide layer is too thin to play the role of passivation and protection, and also avoid that the aluminum oxide layer is too thick and thus affecting the transport efficiency of the carriers.

In some embodiments, the solar cell 100 further includes a second passivation layer 6, and the second passivation layer 6 is provided at a surface of one side of the first passivation layer 5 facing away from the first doped conductive layer 2 along the thickness direction Z of the solar cell 100.

In some embodiments, the second passivation layer 6 can further improve the passivation effect, reduce the interface state density, reduce the recombination of minority carriers, and improve the efficiency of the solar cell 100. The second passivation layer 6 may also have the function of reducing or eliminating reflected light at the surface of the solar cell 100 and increasing the amount of light transmittance, further improving the photoelectric conversion efficiency of the solar cell 100.

In an example, the second passivation layer 6 may be deposited at the local doping region 3 by using a plasma improved chemical vapor deposition method, and of course the second passivation layer 6 can also be formed by using other methods, such as an organic chemical vapor deposition method, or the like. The second passivation layer 6 may be a single-layer structure or a stacked-layer structure, and the refractive index and the thicknesses of each layer may be designed correspondingly. In an example, the second passivation layer 6 may be a combination of any one or more of an aluminum oxide layer, a silicon nitride layer, a silicon oxynitride layer, and a silicon oxide layer. It should be noted that, the second passivation layer 6 may also be another type of passivation layer, no limitation is made herein.

Exemplarily, the second passivation layer 6 is a stacked-layer structure including a silicon nitride layer 61 and a silicon oxynitride layer 62 provided in sequence. The silicon nitride layer 61 and the silicon oxynitride layer 62 have the function of reducing or eliminating the reflected light at the surface of the solar cell 100 and increasing the amount of light transmittance, thereby further improving the photoelectric conversion efficiency of the solar cell.

In some embodiments, as shown in FIG. 1, along the thickness direction Z of the solar cell 100, the thickness of the local doping region 3 is d, where 1 nm≤d≤200 nm. For example, the thickness d of the local doping region 3 may be 1 nm, 5 nm, 10 nm, 20 nm, 50 nm, 80 nm, 100 nm, 150 nm, 200 nm, etc., and of course the thickness d of the local doping region 3 may be other value within the above-mentioned range, which can be specifically set according to actual needs, no limitation is made herein.

In some embodiments, as shown in FIG. 1, if the thickness d of the local doping region 3 is too large, for example, d>200 nm, the doping concentration of the first element is easy to be too high, which would increase the loss of carriers in the transport process, resulting in Auger recombination, and the diffusion process time is longer, leading to an increase in the formation cost of the local doping region 3, thereby reducing the production efficiency of the solar cell 100, and increasing production cost. If the thickness d of the local doping region 3 is too small, for example, d<1 nm, the doping concentration of the first element is too low to play a significant role in improving the ohmic contact. Therefore, when the thickness d of the local doping region 3 satisfies 1 nm≤d≤200 nm, the band gap of the local doping region 3 is relatively low, so as to be able to form good ohmic contact with the first electrode 4, improve the efficiency of the solar cell 100, and make formation and implementation easy and the cost lower.

In some embodiments, in the local doping region 3, the first element accounts for 0.01% to 0.05% of a total number of atoms. For example, the first element may account for 0.01%, 0.02%, 0.03%, 0.04%, 0.05% and the like of the total number of atoms, and it should be noted that, the percentage of the first element accounting for the total number of atoms may be other value within the above-mentioned range, which may be specifically set according to the actual needs and no limitation is made herein.

In some embodiments, if the percentage of the first element accounting for the total number of atoms is too low, the doping concentration of the first element is too low to play a significant role in improving the ohmic contact; and if the percentage of the first element accounting for the total number of atoms is too high, the doping concentration of the first element is too high, such that it is prone to increase the loss of carriers in the transport process, resulting in Auger recombination, and it is not easy to form and implement. Therefore, when the first element accounts for 0.01% to 0.05% of the total number of atoms, the band gap of the local doping region 3 is relatively low, so as to be able to form good ohmic contact with the first electrode 4, improve the efficiency of the solar cell 100, and make formation and implementation easy and the cost lower.

In some embodiments, as shown in FIGS. 1 and 2, a concentration of the first element in the local doping region 3 gradually increases along a direction away from the substrate 1.

In some embodiments, as shown in FIGS. 1 and 2, the concentration of the first element in the local doping region 3 gradually increases along a direction away from the substrate 1, which makes formation and implementation easy, and can ensure that the local doping region 3 can form good ohmic contact between the local doping region 3 and the first electrode 4 and at the same time, prevent the doping concentration of the first element from being too high, thereby reducing the loss of carriers in the transport process, reducing Auger recombination, avoiding the loss of the electric current and the open voltage, and improving the efficiency of the solar cell 100.

In some embodiments, as shown in FIGS. 1 and 2, the local doping region 3 is further doped with oxygen element, and in the local doping region 3, the oxygen element accounts for 0.05% to 0.3% of a total number of atoms. For example, the percentage of the oxygen element accounting for the total number of atoms is 0.05%, 0.1%, 0.15%, 0.2%, 0.25%, 0.3%, etc., and it should be noted that, the percentage of the oxygen element accounting for the total number of atoms can be other value within the above-mentioned range, which can be specifically set according to the actual needs and no limitation is made herein.

In some embodiments, by doping the oxygen element in the local doping region 3, the recombination at the surface of the local doping region 3 can be further reduced, the passivation effect can be improved, which is conducive to the collection of carriers by the first electrode 4, and a parasitic absorption problem caused by too high concentration of doping element can be reduced, so that more light can be absorbed by the substrate 1, which is conducive to improving the transport efficiency of the carriers and improving the performance of the solar cell 100.

In some embodiments, as shown in FIGS. 1 and 2, a concentration of the oxygen element in the local doping region 3 gradually increases along a direction away from the substrate 1, which makes formation and implementation easy, and thus can further improve the production efficiency of the solar cell 100 and save production cost.

It is to be noted that the above-described oxygen element can be doped in a same manner as the first element, i.e., while doping the first element in the chamber of the ALD equipment, the doping of the oxygen element is carried out at the same time, so as to further reduce formation processes, improve formation efficiency, and save production cost. It should be noted that, the oxygen element can also be doped in the local doping region 3 by other means, no limitation is made herein.

In addition, the distribution curve of the oxygen element is also a linear structure, and the doping depth and concentration of the oxygen element can also be adjusted only by the reaction temperature and reaction time.

In some embodiments, as shown in FIGS. 1 and 2, along a thickness direction Z of the solar cell 100, a projected area of the local doping region 3 is 10% to 100% of a projected area of the solar cell 100. For example, the projected area of the local doping region 3 is 10%, 20%, 30%, 40%, 50%, 60%, 70%, 80%, 90%, 100% of the projected area of the solar cell 100, and it should be noted that, other value within the above-mentioned range also is possible, which can be specifically set according to the actual needs and no limitation is made herein.

In some embodiments, as shown in FIGS. 1 and 2, if the projected area of the local doping region 3 is too small, for example, less than 10% of the solar cell 100, the projected area of the local doping region 3 is too small, as a result, while the first electrode 4 is in contact with the local doping region 3, at least a part of the first electrode 4 may also be in contact with the first doped conductive layer 2 or other film layer structure in the solar cell, thereby adversely affecting the transport of carriers and reducing the efficiency of the solar cell 100. Therefore, when the projected area of the local doping region 3 is 10% to 100% of the projected area of the solar cell 100 along the thickness direction Z of the solar cell 100, it can be ensured that the local doping region 3 can be in contact with the entire first electrode 4, so as to ensure that the local doping region 3 can form good ohmic contact with the first electrode 4, to improve the effect of the electrical connection between the local doping region 3 and the first electrode 4, and to facilitate the transport of carriers, thereby improving the efficiency of the solar cell.

Figure 3:
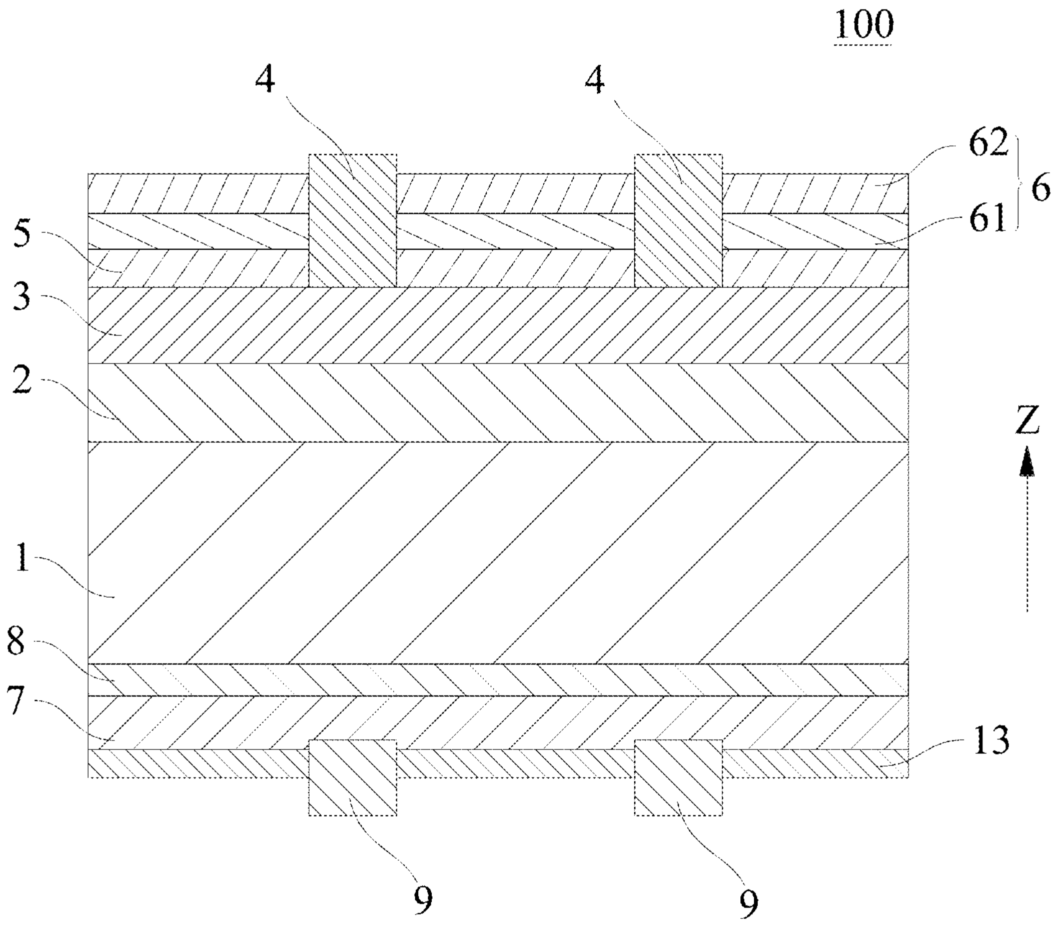
FIG. 3 is a schematic diagram of a cross-sectional structure of a solar cell according to some embodiments of the present disclosure.

In some embodiments, as shown in FIG. 3, when the solar cell 100 is a Tunnel Oxide Passivated Contact (TOPCon)

cell, the solar cell 100 further includes a tunnel oxide layer 8, a second doped conductive layer 7, and a second electrode 9.

The tunnel oxide layer 8 is provided at one side of the substrate 1 facing away from the first doped conductive layer 2. The tunnel oxide layer 8 mainly functions as a tunnel layer for the majority carriers, and at the same time can chemically passivate the surface of the substrate 1, to reduce the interface state density, thereby allowing the majority carriers to tunnel into a doped polysilicon layer, and at the same time can block the recombination of minority carriers. In some embodiments, one or more of a silicon oxide layer, an aluminum oxide layer, a silicon oxynitride layer, a molybdenum oxide layer, and a hafnium oxide layer form a stacked structure. Exemplarily, the tunnel oxide layer 8 may be an ultrathin silicon oxide layer, a thickness of which may generally be within a range from 1 nm to 2 nm, which may be specifically set according to the actual needs and no limitation is made herein. In some embodiments, the tunnel oxide layer 8 may be formed at one side of the substrate 1 facing away from the first doped conductive layer 2 by using an ozone oxidation method, a high-temperature thermal oxidation method, a nitric acid oxidation method, a chemical vapor deposition method, or a low-pressure chemical vapor deposition method, no limitation is made herein.

The second doped conductive layer 7 is provided at one side of the tunnel oxide layer 8 away from the substrate 1. The second doped conductive layer 7 can be used as a field passivation layer, and the second doped conductive layer 7 and the tunnel oxide layer 8 together form a passivation contact structure, thereby further improving the passivation effect at the surface of the substrate 1. The doping element in the second doped conductive layer 7 is the same as that in the substrate 1 and form a concentration difference with the substrate 1, so that the second doped conductive layer 7 can form good contact with the second electrode 9 and an energy band bending can be formed at the surface of the substrate 1, realizing a selective transport of carriers and reducing the loss of recombination. The second doped conductive layer 7 can be formed by depositing at the surface of the tunnel oxide layer 8 by using any one of a physical vapor deposition method, a chemical vapor deposition method, a plasma improved chemical vapor deposition method, and an atomic layer deposition method.

The second electrode 9 is provided at one side of the second doped conductive layer 7 away from the substrate 1 and is electrically connected to the second doped conductive layer 7. The second electrode 9 is used to collect and converge the current of the solar cell 100. Exemplarily, the second electrode 9 may be prepared in a screen printing and sintering manner. In some embodiments, the metal paste used for forming the second electrode 9 may be one or more of aluminum, silver, gold, nickel, molybdenum, or copper, no limitation is made herein.

A fourth passivation layer 13 may be provided at one side of the second doped conductive layer 7 facing away from the tunnel oxide layer 8. The fourth passivation layer 13 can achieve a good passivation for the surface of one side of the second doped conductive layer 7 facing away from the substrate 1, reduce the interface state density, reduce the recombination of minority carriers, and improve the transport efficiency of the carriers at the interface, improve the efficiency of the solar cell 100. Exemplarily, the plasma improved chemical vapor deposition method may be used to deposit the fourth passivation layer 13, and of course other methods, such as organic chemical vapor deposition, etc., may be used to form the fourth passivation layer 13. The fourth passivation layer 13 may be a single-layer structure or a stacked-layer structure, and the thickness of each layer may be designed correspondingly. In an example, the fourth passivation layer 13 may be any one or a combination of a silicon nitride layer, a silicon oxynitride layer, a silicon oxide layer, and an aluminum oxide layer. It should be noted that, the fourth passivation layer 13 may also be another type of passivation layer, no limitation is made herein.

Figure 4:
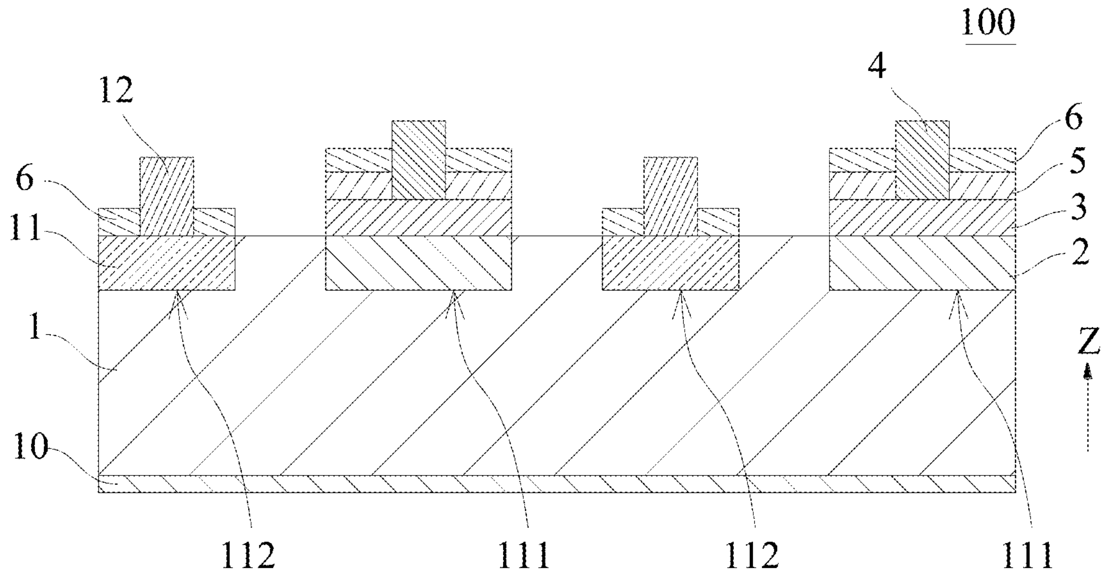
FIG. 4 is a schematic diagram of a sectional structure of a solar cell according to some embodiments of the present disclosure.

In some embodiments, as shown in FIG. 4, when the solar cell 100 is an interdigitated back contact (IBC) cell, the substrate 1 of the solar cell 100 includes P-type conductive regions 111 and N-type conductive regions 112 which are arranged alternately and provided at intervals. The P-type conductive region 111 is provided with the first doped conductive layer 2, the local doping region 3 and the first electrode 4 arranged sequentially, and the first electrode 4 is electrically connected to the local doping region. The N-type conductive region 112 is provided with the third doped conductive layer 11 and the third electrode 12 which are arranged sequentially, and the third electrode 12 is electrically connected to the third doped conductive layer 11.

As shown in FIG. 4, by providing the local doping region 3 in each of the P-type conductive regions 111, the transport of electric current in the each of the P-type conductive regions 111 is facilitated, thereby improving the overall efficiency of the solar cell 100.

In some embodiments, as shown in FIG. 4, the solar cell 100 further includes a third passivation layer 10 provided at one side of the substrate 1 facing away from the P-type conductive regions 111 and the N-type conductive regions 112.

In some embodiments, the third passivation layer 10 can achieve a good passivation for the surface of the substrate 1, reduce the interface state density, reduce the recombination of minority carriers, improve the transport efficiency of the carriers at the interface, and improve the efficiency of the solar cell 100.

Exemplarily, the plasma improved chemical vapor deposition method may be used to deposit the third passivation layer 10, and it should be noted that, other methods, such as organic chemical vapor deposition, etc., may be used to form the third passivation layer 10. The third passivation layer 10 may be a single-layer structure or a stacked-layer structure, and the thickness of each layer may be designed correspondingly. In an example, the third passivation layer 10 may be any one or a combination of a silicon nitride layer, a silicon oxynitride layer, a silicon oxide layer, and an aluminum oxide layer. It should be noted that, the third passivation layer 10 may also be another type of passivation layer, no limitation is made herein.

Figure 5:
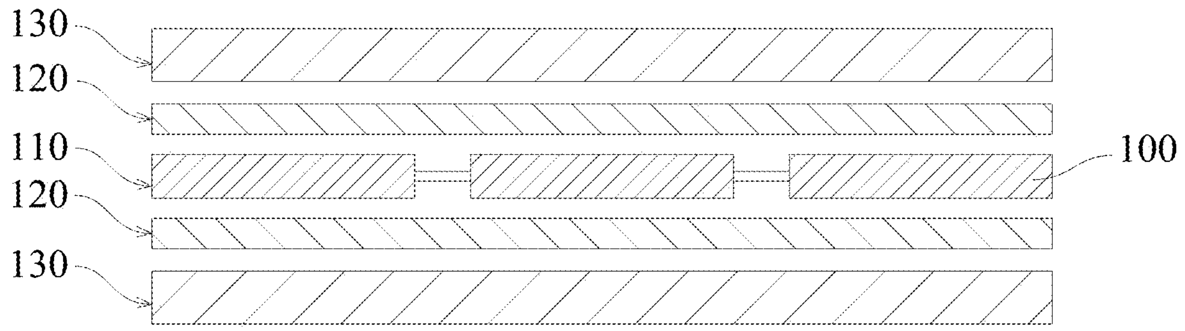
FIG. 5 is a schematic structural diagram of a photovoltaic module according to some embodiments of the present disclosure.

The present disclosure further provides a photovoltaic module, as shown in FIG. 5, the photovoltaic module includes a cell string 110, an encapsulation layer 120, and a cover plate 130. The cell string 110 is formed by connecting a plurality of solar cells 100 as described in any of the above embodiments. The encapsulation layer 120 is used to cover a surface of the cell string 110. The cover plate 130 is used to cover a surface of the encapsulation layer 120 away from the cell string 110. Since the solar cell 100 has the above-described technical effects, the photovoltaic module including the solar cell 100 shall also have the above-described technical effects, which will not be repeated herein.

As shown in FIG. 5, the solar cells 100 are electrically connected in the form of a whole piece or a plurality of sub-pieces to form a plurality of cell strings 110, and the plurality of cell strings 110 are electrically connected in a series and/or parallel connection manner. In an example, the plurality of cell strings 110 may be electrically connected to each other by conductive belts. The encapsulation layer 120 covers a front side and a back side of the solar cell, and in an example, the encapsulation layer 120 may be an organic encapsulation adhesive film, such as an ethylene vinyl acetate (EVA) adhesive film, a polyethylene octane elastomer (POE) adhesive film, a polyethylene terephthalate (PET) adhesive film, a polyvinyl butyral (PVB) adhesive film, or the like. The cover plate 130 may be a cover plate 130 with a light transmittance function, such as a glass cover plate, a plastic cover plate, etc. In an example, a surface of the cover plate 130 facing the encapsulation layer 120 may be a concave-convex surface, so as to increase the utilization rate of the incident light.

Figure 6:
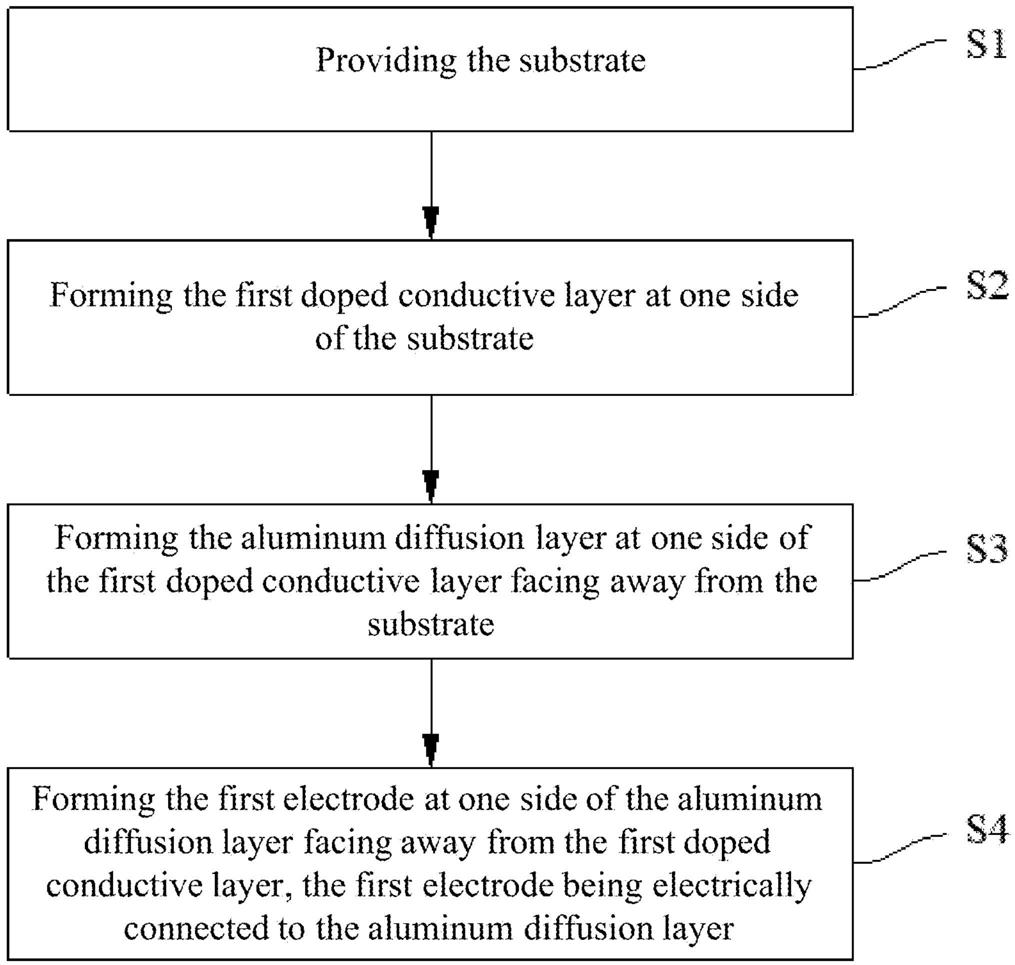
FIG. 6 is a flow chart of a method for forming solar cell according to some embodiments of the present disclosure.

The present disclosure further provides a method for forming a solar cell 100 as described in any one of the above-described embodiments. As shown in FIG. 6, the method including the following steps.

At step S1, the substrate 1 is provided.

At this step, the substrate 1 is used for receiving incident light and generating photogenerated carriers, as shown in FIG. 1. In some embodiments, the substrate 1 is a silicon substrate and may include one or more of monocrystalline silicon, polycrystalline silicon, amorphous silicon, or microcrystalline silicon. In other embodiments, a material of the substrate 1 may be silicon carbide, an organic material, or a polycompound. The polycompound may include, but is not limited to, a material such as perovskite, gallium arsenide, cadmium telluride, copper indium selenide, and the like. Exemplarily, in some embodiments of the present disclosure, the substrate 1 is a monocrystalline silicon substrate.

The substrate 1 contains a doping element, and the type of the doping element may be N-type or P-type. The N-type element may be a Group V element, such as phosphorus (P) element, bismuth (Bi) element, antimony (Sb) element, arsenic (As) element, and the like. The P-type element may be a Group III element, such as boron (B) element, aluminum (Al) element, gallium (Ga) element, indium (In) element, and the like. For example, when the substrate 1 is a P-type silicon substrate, the type of the doping element in the substrate 1 is P-type. In another example, when the substrate 1 is an N-type silicon substrate, the type of the doping element in the substrate 1 is N-type. Exemplarily, in some embodiments of the present disclosure, the substrate 1 is an N-type silicon substrate, thereby improving the conversion efficiency of the solar cell 100 and reducing manufacturing cost.

At step S2, the first doped conductive layer 2 is formed at one side of the substrate 1, as shown in FIG. 1.

At this step, the first doped conductive layer 2 may serve as an emitter. The first doped conductive layer 2 has a different type of doping element from that in the substrate 1, and the first doped conductive layer 2 and the substrate 1 may together form a PN junction structure to improve the efficiency of the solar cell 100. Exemplarily, the first doped conductive layer 2 may be formed by performing boron diffusion at the surface of the substrate 1. Exemplarily, when the substrate 1 is an N-type substrate, the first doped conductive layer 2 of P-type may be formed by using a boron source by diffusion process to make the boron atoms diffuse into a certain depth of the substrate 1. The boron source may be, for example, liquid boron tribromide.

At step S3, as shown in FIG. 1, the local doping region 3 is formed at one side of the first doped conductive layer 2 facing away from the substrate 1, and the local doping region 3 is doped with first element.

At this step, a bandgap width of the first element is relatively low, and the doping of the first element can reduce the bandgap width of the local doping region 3, reduce the contact resistivity between the first electrode 4 and the local doping region 3, and form better ohmic contact. The local doping region 3 is in contact with the first electrode 4, to serve as a carrier transport bridge.

At step S4, the first electrode 4 is formed at one side of the local doping region 3 facing away from the first doped conductive layer 2, and the first electrode 4 is electrically connected to the local doping region 3.

At this step, the first electrode 4 is used to collect and converge the current of the solar cell 100. Exemplarily, the first electrode 4 may be formed in a screen printing and sintering manner. In some embodiments, the metal paste used for forming the first electrode 4 may be one or more of aluminum, silver, gold, nickel, molybdenum, or copper, no limitation is made herein.

In some embodiments, as shown in FIG. 1, the local doping region 3 is doped with a same doping element as that in the first doping conductive layer 2 and first element. The first element is one selected from the group consisting of aluminum element, titanium element, zinc element, zirconium element, hafnium element, molybdenum element, tungsten element, and nickel element. The band gap width of the aluminum element is lower than the band gap width of the silicon element, and in the doping process of aluminum element, aluminum atoms can occupy the positions of silicon atoms to form Si-Al bonds through substitutional doping, or aluminum atoms can be interstitially doped between the Si-Si bonds, so that the surface barrier of the local doping region 3 can be reduced and the band gap width of the local doping region 3 is reduced, thereby reducing the contact resistivity between the first electrode 4 and the local doping region 3, so that the first electrode 4 can form better ohmic contact with the local doping region 3, thereby reducing the loss of carriers in the transport process, which is conducive to the transport of carriers, improving the fill factor of the solar cell 100, and improving the efficiency of the solar cell.

In some embodiments, at step S3, i.e., forming the local doping region 3 at one side of the first doped conductive layer 2 facing away from the substrate 1 may include the following steps.

At step S32, the first passivation layer 5 including first element is formed at a surface of one side of the first doped conductive layer 2 facing away from the substrate 1.

At this step, the first passivation layer 5 can achieve a good passivation for the surface of one side of the first doped conductive layer 2 facing away from the substrate 1, reduce the interface state density, reduce the recombination of minority carriers, and improve the transport efficiency of the carriers at the interface, thereby improving the efficiency of the solar cell 100. The first passivation layer 5 may also have the function of reducing or eliminating the reflected light at the surface of the solar cell and increasing the amount of light transmittance, thereby further improving the photoelectric conversion efficiency of the solar cell.

In an example, the first passivation layer 5 can be deposited at one side of the first doped conductive layer 2 facing away from the substrate 1 by using a plasma improved chemical vapor deposition method, and it should be noted that, the first passivation layer 5 can also be formed by using other methods, such as an organic chemical vapor deposition method, or the like. The first passivation layer 5 may be a single-layer structure or a stacked-layer structure, and a refractive index and a thickness of each layer may be correspondingly designed. In some other embodiments, the first passivation layer 5 may be any one of aluminum oxide layer, a silicon nitride layer, a silicon oxynitride layer, and a silicon oxide layer, or a combination thereof. It should be noted that, the first passivation layer 5 may also adopt another type of passivation layer, no limitation is made herein.

In some embodiments of the present disclosure, the first passivation layer 5 is an aluminum oxide layer, and an atomic layer deposition (ALD) technique may be used to deposit the first element on the first doped conductive layer 2 to form the first passivation layer 5.

At step S33, the first passivation layer 5 is heated to convert at least a part of the first doped conductive layer 2 in contact with the first passivation layer 5 to form the local doping region 3, where a heating temperature is controlled to be within a range from 200° C. to 400° C. and a constant-temperature lasts for a duration within a range from 1s to 400s.

At this step, at a heating condition, the first element in the first passivation layer 5 can be advanced to the inside of the first doped conductive layer 2, and the first doped conductive layer 2 can be doped with the first element in the first passivation layer 5, to form the local doping region 3 having a certain thickness, and the depth and concentration of the first element in the first doped conductive layer 2 can be adjusted by controlling the reaction temperature and reaction time.

In some embodiments, when the first passivation layer 5 includes the first element, an atomic layer deposition (ALD) technique may be used to deposit the first element on the first doped conductive layer 2 to form the first passivation layer 5, and under a continuous heating condition, the first element is advanced to the inside of the first doped conductive layer 2, and the first doped conductive layer 2 is doped with the first element in the first passivation layer 5, to form the local doping region 3 having a certain thickness, and the distribution curve of the first element is a linear structure. The depth and concentration of the first element in the first doped conductive layer 2 can be adjusted by controlling the reaction temperature and reaction time, which has the advantages of precise control, low cost, and simple operation, and the like. And, because the first element in the first passivation layer 5 is used as a diffusion source of the first element, with which the first doped conductive layer 2 is doped, the diffusion process can be carried out directly in a chamber of a ALD equipment, without the need for an additional equipment and without the need to replace the chamber and the existing process, thereby further reducing the difficulty of performing aluminum doping on the first doped conductive layer 2, and thus making the formation of the local doping region 3 easier, improving the efficiency of the production of the solar cell, and saving cost.

As the heating temperature rises, the constant-temperature duration thereof may be lowered accordingly, and it should be noted that, consistent variable temperature heating is also possible, no limitation is made herein. And if the heating temperature is too low, for example, lower than 200° C., the constant-temperature duration needs to be longer, and the diffusion power for the first element is insufficient, and it is not easy to adjust the diffusion depth and concentration of the first element; and if the heating temperature is too high, for example, higher than 400° C., the molecular movement in the chamber is too high, and the film layer of the first passivation layer 5 is unstable, which easily causes damage to the first passivation layer 5. Therefore, when the heating temperature is controlled to be within a range from 200° C. to 400° C. and the constant-temperature duration is controlled to be within a range from 1s to 400s, the diffusion power for the first element is sufficient, it is easy to form the local doping region 3, no damage to the first passivation layer 5 will be caused, and the stability of the first passivation layer 5 is improved.

As shown in FIGS. 1 and 2, where the first passivation layer 5 is an aluminum oxide layer, the thickness of the first passivation layer 5 in the thickness direction Z may be within a range from 1 nm to 10 nm. Further, the thickness of the aluminum oxide layer may be within a range from 3 nm to 5 nm, so as to avoid that the aluminum oxide layer is too thin to play the role of passivation and protection, and also avoid that the aluminum oxide layer is too thick and thus affects the transport efficiency of the carriers.

In some embodiments, at step S3, i.e., forming the local doping region 3 at one side of the first doped conductive layer 2 facing away from the substrate 1 includes the following steps.

At step S34, an aluminum source is introduced, where a flow rate of introducing the aluminum source is within a range from 10 sccm to 30 sccm, and a duration of introducing the aluminum source is within a range from 1s to 300s.

In some embodiments, by introducing the aluminum source, the efficiency of diffusion of the first element into the first doped conductive layer 2 can be improved, so that the production efficiency of the solar cell 100 is improved, and it is easier to accurately adjust the doping depth and concentration of the first element to improve the efficiency of the solar cell. The flow rate of introducing the aluminum source is within a range from 10 sccm to 30 sccm, and the duration of introducing the aluminum source is within a range from 1s to 300s, so as to ensure that the first doped conductive layer 2 can be sufficiently doped with the first element, to form the local doping region 3 having a certain thickness.

The aluminum source may be trimethylaluminum or trimethylaluminum and water vapor, and it should be noted that, the aluminum source may also be other substance containing the first element, no limitation is made herein.

In some embodiments, prior to the step S32, i.e., forming the first passivation layer 5 including first element at the surface of one side of the first doped conductive layer 2 facing away from the substrate 1, the method further includes the following steps.

At step 31, masking is performed at a region of the first doped conductive layer 2 not corresponding to the electrode.

At this step, the region not corresponding the electrode is the region of the first doped conductive layer 2 not corresponding to the first electrode 4. Exemplarily, masking may be performed at the region not corresponding the electrode of the first doped conductive layer 2 by means of a laser, an ink coating, etc., and of course masking can be performed by other means, no limitation is made herein.

In some embodiment, as shown in FIG. 2, by performing masking at the region of the first doped conductive layer 2 not corresponding to the electrode, the local doping region 3 can be provided at the portion of the first doped conductive layer 2 corresponding to the first electrode 4, so that while ensuring that the local doping region 3 can form better ohmic contact with the first electrode 4, the first element doping concentration in the portion of the first doped conductive layer 2 not corresponding to the first electrode 4 (i.e., the region not corresponding to the electrode) is prevented from being too high, so as to reduce the loss of carriers in the transmission process, reduce Auger recombination, avoid the loss of current and turn-on voltage, and further improve the efficiency of the solar cell 100.

When the local doping region 3 is provided at the portion of the first doped conductive layer 2 corresponding to the first electrode 4, exemplarily, the local doping region 3 may be provided at a surface of one side of the first doped conductive layer 2 facing away from the substrate 1; exemplarily, the local doping region 3 may be partially provided in the first doped conductive layer 2; or exemplarily, the local doping region 3 may be provided in the first doped conductive layer 2, as long as it is ensured that the first electrode 4 can be electrically connected to the local doping region 3, no limitation is made herein.

It is to be noted that at step S3, in the step of forming the local doping region 3 at one side of the first doped conductive layer 2 facing away from the substrate 1, exemplarily, the heating temperature in the chamber may be adjusted to be within a range from 200° C. and 400° C., and the constant-temperature may last for a duration within a range from 1s and 400s, that is, by only continuously heating, the first doped conductive layer 2 is doped with the first element in the first passivation layer 5, to form the local doping region 3; exemplarily, by only introducing the aluminum source only, the first doped conductive layer 2 is doped with the first element in the first passivation layer 5, to form the local doping region 3; or exemplarily, the heating temperature in the chamber may be adjusted to be within a range from 200° C. and 400° C., and the constant-temperature may last for a duration within a range from 1s and 400s, and by simultaneously introducing the aluminum source, the first doped conductive layer 2 is doped with the first element in the first passivation layer 5, to form the local doping region 3, thereby further improving the production efficiency, so that the duration of an entire process can be controlled within a range from 30 min to 90 min, which is conducive to the mass production of the solar cell 100.

It should be noted that, in some other embodiments, the first element can also be injected into the first doped conductive layer 2 to form the local doping region 3 by other means, such as ion injection and the like, or, the local doping region 3 can also be directly formed at one side of the first doped conductive layer 2 facing away from the substrate 1, no limitation is made herein.

In some embodiments, the thickness of the local doping region 3 is d, where 1 nm≤d≤200 nm, for example, the thickness d of the local doping region 3 may be 1 nm, 5 nm, 10 nm, 20 nm, 50 nm, 80 nm, 100 nm, 150 nm, 200 nm, etc., and it should be noted that, the thickness d of the local doping region 3 may be other value within the above-mentioned range, which may be specifically set according to actual needs, no limitation is made herein.

As shown in FIG. 1, if the thickness d of the local doping region 3 is too large, for example, d>200 nm, the doping concentration of the first element is easy to be too high, thereby increasing the loss of carriers in the transport process, resulting in Auger recombination, and a duration of the diffusion process is longer, leading to an increase in the cost of forming the local doping region 3, thereby reducing the production efficiency of the solar cell 100, and increasing production cost. If the thickness d of the local doping region 3 is too small, for example, d<1 nm, the doping concentration of the first element is too low to play a significant role in improving the ohmic contact. Therefore, when the thickness d of the local doping region 3 satisfies 1 nm≤d≤200 nm, a band gap of the local doping region 3 is relatively low, so as to be able to form good ohmic contact with the first electrode 4, improve the efficiency of the solar cell 100, and make formation and implementation easy and the cost lower.

In some embodiments, an ambient pressure intensity may be within a range from 3 mbar to 15 mbar, for example, the ambient pressure intensity may be 3 mbar, 5 mbar, 8 mbar, 11 mbar, 15 mbar, etc., and of course the ambient pressure intensity may also be other value within the above-mentioned range, which can be set and selected according to actual needs, no limitation is made herein.

If the ambient pressure intensity is too low, for example, lower than 3 mbar, it is not conducive to the diffusion of the first element, and inert gas needs to be additionally supplied, so as to meet the diffusion condition, thereby increasing production cost; and if the ambient pressure intensity is too high, for example, higher than 15 mbar, the diffusion of the first element is too fast, which is not easy to be controlled. Therefore, when the ambient pressure intensity is within a range from 3 mbar to 15 mbar, it is conducive to the diffusion of first element, and it is easy to realize the adjustment of the diffusion depth and concentration of the first element.

In some embodiments, in the local doping region 3, the first element accounts for 0.01% to 0.05% of a total number of atoms. For example, the first element may account for 0.01%, 0.02%, 0.03%, 0.04%, 0.05% and the like of the total number of atoms, and it should be noted that, the percentage of the first element accounting for the total number of atoms may be other value within the above-mentioned range, which may be specifically set according to actual needs, no limitation is made herein.

If the percentage of the first element accounting for the total number of atoms is too low, the doping concentration of the first element is too low to play a significant role in improving the ohmic contact; and if the percentage of the first element accounting for the total number of atoms is too high, the doping concentration of the first element is too high, such that it is prone to increase the loss of carriers in the transport process, resulting in Auger recombination, and it is not easy to form and implement. Therefore, when the first element accounts for 0.01% to 0.05% of the total number of atoms, a band gap of the local doping region 3 is relatively low, so as to be able to form good ohmic contact with the first electrode 4, improve the efficiency of the solar cell 100, and make formation and implementation easy and the cost lower.

In some embodiments, as shown in FIGS. 1 and 2, a concentration of the first element in the local doping region 3 gradually increases along a direction away from the substrate 1.

In some embodiments, as shown in FIGS. 1 and 2, the concentration of the first element in the local doping region 3 gradually increases along a direction away from the substrate 1, which makes formation and implementation easy, and can ensure that the local doping region 3 can form good ohmic contact with the first electrode 4, and at the same time, can prevent the doping concentration of the first element from being too high, thereby reducing the loss of carriers in the transport process, reducing Auger recombination, avoiding the loss of the electric current and the open voltage, and improving the efficiency of the solar cell 100.

In some embodiments, along a thickness direction Z of the solar cell 100, a projected area of the local doping region 3 is 10% to 100% of a projected area of the solar cell 100. For example, the projected area of the local doping region 3 is 10%, 20%, 30%, 40%, 50%, 60%, 70%, 80%, 90%, 100% of the projected area of the solar cell 100, and it should be noted that, other value within the above-mentioned range is also possible, which can be specifically set according to actual needs, no limitation is made herein.

As shown in FIGS. 1 and 2, if the projected area of the local doping region 3 is too small, for example, less than 10% of that of the solar cell 100, the projected area of the local doping region 3 is too small, as a result, while the first electrode 4 is in contact with the local doping region 3, at least a part of the first electrode 4 may also be in contact with the first doped conductive layer 2 or other film layer structure in the solar cell, to adversely affect the transport of carriers and reduce the efficiency of the solar cell 100. Therefore, when the projected area of the local doping region 3 is 10% to 100% of the projected area of the solar cell 100 along the thickness direction Z of the solar cell 100, it can be ensured that the local doping region 3 can be in contact with the entire first electrode 4, so as to ensure that the local doping region 3 can form good ohmic contact with the first electrode 4, to improve the effect of the electrical connection between the local doping region 3 and the first electrode 4, and to facilitate the transport of carriers, thereby improving the efficiency of the solar cell.

In some embodiments, the local doping region 3 is further doped with oxygen element, and in the local doping region 3, the oxygen element accounts for 0.05% to 0.3% of a total number of atoms. For example, the percentage of the oxygen element accounting for the total number of atoms is 0.05%, 0.1%, 0.15%, 0.2%, 0.25%, 0.3%, etc., and it should be noted that, the percentage of the oxygen element accounting for the total number of atoms can be other value within the above-mentioned range, which can be specifically set according to actual needs, no limitation is made herein.

By doping the oxygen element in the local doping region 3, the recombination at the surface of the local doping region 3 can be further reduced, the passivation effect can be improved, which is conducive to the collection of carriers by the first electrode 4, and the parasitic absorption problem caused by too high concentration of doping element can be reduced, so that more light can be absorbed by the substrate 1, which is conducive to improving the transport efficiency of the carriers and improving the performance of the solar cell 100.

In some embodiments, as shown in FIGS. 1 and 2, a concentration of the oxygen element in the local doping region 3 gradually increases along a direction away from the substrate 1, which makes formation and implementation easy, and thus can further improve the production efficiency of the solar cell 100 and save production cost.

It is to be noted that the above-described oxygen element can be doped in a same manner as the first element, i.e., while doping the first element in the chamber of the ALD equipment, the doping of the oxygen element is carried out, so as to further reduce formation processes, improve formation efficiency, and save production cost. It should be noted that, the local doping region 3 can be doped with the oxygen element by other means, no limitation is made herein.

While doping the first element, oxygen, ozone and/or water vapor may be continuously introduced to facilitate the doping of the oxygen element and further improve the doping efficiency of the first element.

In addition, the distribution curve of the oxygen element is also a linear structure, and the doping depth and concentration of the oxygen element can also be adjusted only by the reaction temperature and reaction time.

In addition, in addition to the above-mentioned steps, the forming method may also include the steps of texturing, boron diffusion, etching, formation of a tunnel oxide layer, formation of a doped conductive layer, phosphorus diffusion, passivation, and metallization of the substrate, etc., and the embodiments of the present disclosure do not limit the specific operation thereof, which may adopt conventional technical means in the art, which is not repeated herein.

In addition, in other embodiments, depending on the cell structure, the method for forming the solar cell may also adopt other formation processes, and the rest of the operation processes or sequences in the formation of the solar cell may be adjusted according to actual situations, no limitation is made herein. The same or similar parts between the various embodiments in this specification can be referred to each other. In particular, for the device embodiments and the terminal embodiments, since they are basically similar to the method embodiments, the description thereof is relatively simple, and the relevant parts can be referred to the description in the method embodiments.

The above description merely illustrates the implementations of some embodiments of the present application, but a scope of the embodiments of the present application is not limited thereto, and any change or substitution within the technical scope disclosed in the embodiments of the present application shall fall within a scope of the embodiments of the present application. Therefore, the scope of the embodiments of the present application shall be based a scope of the claims.

What is claimed is:

1. A solar cell, comprising:

a silicon substrate comprising one or more of monocrystalline silicon, polycrystalline silicon, amorphous silicon, or microcrystalline silicon;

a first doped conductive layer formed at one side of the substrate, the first doped conductive layer and the silicon substrate having different types of doping elements;

a local doping region formed at one side of the first doped conductive layer away from the silicon substrate, wherein the local doping region is doped with a same doping element as that in the first doped conductive layer and a first element; and a first electrode provided at one side of the local doping region away from the first doped conductive layer and electrically connected to the local doping region;

wherein the local doping region covers an entire surface of one side of the first doped conductive layer away from the silicon substrate.

2. The solar cell according to claim 1, wherein the first element is one selected from the group consisting of aluminum element, titanium element, zinc element, zirconium element, hafnium element, molybdenum element, tungsten element, and nickel element.

3. The solar cell according to claim 1, wherein the solar cell further comprises a first passivation layer provided at a surface of one side of the local doping region away from the first doped conductive layer, wherein the first electrode passes through the first passivation layer to be electrically connected to the local doping region.

4. The solar cell according to claim 3, wherein the first passivation layer has the same metal element as the first element.

5. The solar cell according to claim 4, wherein the first passivation layer is an aluminum oxide layer.

6. The solar cell according to claim 1, wherein the local doping region is provided at a portion of the first doped conductive layer corresponding to the first electrode.

7. The solar cell according to claim 6, wherein the solar cell further comprises a first passivation layer, wherein at least a part of the first passivation layer is provided at a surface of one side of the first doped conductive layer away from the silicon substrate, and the first electrode passes through the first passivation layer to be electrically connected to the local doping region.

8. The solar cell according to claim 1, wherein a thickness of the local doping region along a thickness direction of the solar cell is d, where 1 nm≤d≤200 nm.

9. The solar cell according to claim 1, wherein in the local doping region (3), the first element accounts for 0.01% to 0.05% of a total number of atoms.

10. The solar cell according to claim 1, wherein a concentration of the first element in the local doping region increases along a direction away from the silicon substrate.

11. The solar cell according to claim 1, wherein the local doping region is further doped with oxygen element.

12. The solar cell according to claim 11, wherein in the local doping region, the oxygen element accounts for 0.05% to 0.3% of a total number of atoms.

13. The solar cell according to claim 11, wherein a concentration of the oxygen element in the local doping region increases along a direction away from the silicon substrate.

14. The solar cell according to claim 1, wherein along a thickness direction of the solar cell, a projected area of the local doping region is 10% to 100% of a projected area of the solar cell.

15. The solar cell according to claim 1, wherein the solar cell further comprises:

a tunnel oxide layer provided at one side of the silicon substrate facing away from the first doped conductive layer;

a second doped conductive layer provided at one side of the tunnel oxide layer away from the silicon substrate; and a second electrode provided at one side of the second doped conductive layer away from the silicon substrate and electrically connected to the second doped conductive layer.

16. The solar cell according to claim 1, wherein the silicon substrate comprises P-type conductive regions and N-type conductive regions which are arranged alternately and provided at intervals; each of the P-type conductive regions is provided with the first doped conductive layer, the local doping region and the first electrode which are arranged sequentially, and the first electrode is electrically connected to the local doping region; and each of the N-type conductive regions is provided with a third doped conductive layer and a third electrode which are arranged sequentially, and the third electrode is electrically connected to the third doped conductive layer.

17. The solar cell according to claim 16, wherein the solar cell further comprises a third passivation layer provided at one side of the silicon substrate facing away from the P-type conductive regions and the N-type conductive regions.

18. The solar cell according to claim 1, wherein a sectional shape of the local doping region is one of rectangle, triangle, semicircle and trapezoid.

19. A photovoltaic module, comprising:

a cell string formed by connecting a plurality of solar cells according to claim 1;

an encapsulation layer for covering a surface of the cell string; and a cover plate for covering a surface of the encapsulation layer away from the cell string.

* * * * *